US008013237B2

(12) United States Patent
Li

(10) Patent No.: US 8,013,237 B2
(45) Date of Patent: Sep. 6, 2011

(54) INTEGRATED PHOTOVOLTAIC MODULAR PANEL FOR A CURTAIN WALL GLASS

(76) Inventor: Yi Li, Shenzhen (CN)

( * ) Notice: Subject to any disclaimer, the term of this patent is extended or adjusted under 35 U.S.C. 154(b) by 1360 days.

(21) Appl. No.: 11/419,498

(22) Filed: May 23, 2006

(65) Prior Publication Data

US 2008/0163918 A1 Jul. 10, 2008

(30) Foreign Application Priority Data

May 25, 2005 (CN) .......................... 2005 1 0034904

(51) Int. Cl.
*H01L 31/042* (2006.01)
(52) U.S. Cl. .......................... 136/248; 136/244; 136/251
(58) Field of Classification Search ........... 136/243–265
See application file for complete search history.

(56) References Cited

U.S. PATENT DOCUMENTS

| 4,283,106 | A | * | 8/1981 | Bunnell | 439/571 |
| 5,221,363 | A | * | 6/1993 | Gillard | 136/248 |
| 6,111,189 | A | * | 8/2000 | Garvison et al. | 136/244 |
| 6,459,033 | B1 | * | 10/2002 | Muller | 136/244 |

FOREIGN PATENT DOCUMENTS

| DE | 3111969 A1 | 3/1981 |
| DE | 4140682 A1 | 12/1991 |
| DE | 19502949 A1 | 1/1995 |
| DE | 19503195 A1 | 2/1995 |
| DE | 19919215 A1 | 11/1999 |
| DE | 10109643 A1 | 2/2001 |
| EP | 0798787 A2 | 3/1997 |
| EP | 0993051 A2 | 8/1999 |
| JP | 56-15084 | 2/1981 |
| JP | 56-017081 | 2/1981 |
| JP | 58-77069 | 5/1983 |
| JP | 08-186280 | 7/1996 |
| JP | 08186280 A | 7/1996 |
| JP | 09-135039 | 5/1997 |
| JP | 10-331369 | 12/1998 |
| JP | 10331369 A | 12/1998 |
| JP | 11022127 A | 1/1999 |

* cited by examiner

*Primary Examiner* — Basia Ridley
*Assistant Examiner* — Christina Chern
(74) *Attorney, Agent, or Firm* — Wenye Tan

(57) ABSTRACT

An integrated photovoltaic modular panel for a curtain wall glass is used to build integrated photovoltaic material. This invention provides standardized photovoltaic units, so that electrodes in a photovoltaic panel main body can be connected internally in parallel. The connector may be a metal piece of stamping or casting with a plug 1 and a socket 2 on two ends, a waist b in the middle, an inward concave straight strip 4 on both sides of the waist, an electrode plug-in socket 3 in the waist for firmly clamping solar cell, a plastic injection molding crust 5 for fixing and securing the connector, thus forming a module. It can be combined with different kinds of glass to form different kinds of photovoltaic curtain wall glass. The solar cell here may be an amorphous silicon solar cell.

4 Claims, 8 Drawing Sheets

INTEGRATED PHOTOVOLTAIC MODULAR PANEL FOR A CURTAIN WALL GLASS

BACKGROUND OF THE INVENTION

1. Field of the Invention

The present invention is related to an integrated photovoltaic modular panel for a curtain wall More specifically, it is related to a photovoltaic panel with amorphous silicon thin film solar cells.

2. Description of the Related Art

Currently, solar cells are connected together by conductive wires to form a panel with hollow glass or laminated glass. Positive electrodes or negative electrodes on every photovoltaic panel solar cell are connected in either series or parallel. The internal wires are soldered together with an external lead. The more solar cells are connected in parallel, the lower is the mounting efficiency. Regardless of types of power supply systems, e.g., a stand-alone system or a networked system, the core of a PV system remains a photovoltaic panel made of solar cells. A thin film solar cell does not use a silicon wafer. Instead, it uses a nanometer semiconductor active layer deposited on an inexpensive substrate, such as glass. Thus, material cost is greatly reduced. In addition, there are benefits in manufacturing under a lower temperature than otherwise and a larger size thin film solar cell can be produced.

At present, the photovoltaic panels made from crystal or amorphous silicon solar cells can be used as curtain-wall building materials. A peak power of an amorphous silicon solar cell can reach above 60 Wp. With larger area and better rigidity, the amorphous silicon solar cell is suitable for making large and extra-large size photovoltaic panels being used as photovoltaic curtain wall glasses. Buildings built by this material meet the second security standard requirements due to good rigidity and high insulation. In accordance with industrial standard requirements for battery material, the photovoltaic panel can last more than 10 years even used in a tough environment with temperatures ranging from positive 90 degree to negative 50 degree Celsius.

A metal frame for supporting solar cells is disclosed in the Chinese invention (application number 200410028002.8), where solar cells are amorphous silicon solar cells which could be large in size, high in rigidity and few in electrode connections. In addition, the solar cells are easy to form into a desirable patterns for light transmission and adaptable to conform with architecture aesthetic demands. An issue associated with increasing photovoltaic panels being used as curtain wall glass is that the assembly process can become very complicated and time consuming for the large number of electrodes. The inner structure of the curtain wall glass may need to be changed resulting in occupying more space for transportation. In addition, this makes maintenance work more difficult, because for example, the whole frame needs to be dismantled to replace a broken solar cell.

SUMMARY OF THE INVENTION

The present invention provides an integrated photovoltaic modular panel for a curtain wall glass, whose internal electrodes are connected by the means of joining photovoltaic units through plugging connectors together as simple as playing building blocks.

One object of the present invention is to provide a standardized connector on the photovoltaic panel so that the connector becomes an independent device and can be quickly connected with various electrodes in different ways.

Another object of the present invention is to provide a photovoltaic unit with solar cell strips and connectors. The solar cell strips are made from thin film solar cells, especially for large size amorphous silicon thin film solar cells. The main body of an integrated photovoltaic modular panel is created by connecting in parallel internal electrodes of several photovoltaic units together. It is then assembled together with hollow glass or laminated glass to form a building integrated photovoltaic system.

An integrated photovoltaic modular panel for a curtain wall glass according to this invention comprises a photovoltaic panel main body where internal electrodes are connected. Two electrode plugs of a solar cell are respectively inserted into a connector, forming a photovoltaic unit. A plurality of photovoltaic units are plugged together through said similar connector, forming a photovoltaic panel main body.

Internal electrodes of the photovoltaic units composed of positive electrodes and negative electrodes for each solar cell. The connector is a metal piece of stamping or casting, which has a plug and a socket on both ends, and an electrode plug-in socket at the waist. The plug is a long spindle and the socket on the bottom is a slot with biconcave section being flexible, by which the plug is conveniently plugged into or unplug therefrom said socket, having excellent electrical contact for a tight fit. The connector may have a plane symmetry structure.

The connector has a slantwise or upright electrode plug-in socket at the waist, which has excellent electrical contact with insertable electrode for firmly fastening. The connector may have an insulated crust all around and a plurality of fixed holes are set on a surface of said insulated crust. The surface of solar cells can be pasted with transparent sheet.

An integrated photovoltaic modular panel comprises cells, glass and other accessories, and a photovoltaic panel main body has a plurality of photovoltaic units with their positive electrodes or negative electrodes connected in parallel. Two electrode plugs of a thin film solar cell strip are respectively inserted into a connector, forming a photovoltaic unit. Surfaces of the solar cells in the photovoltaic units can be pasted with a transparent sheet to agglutinate and seal with exterior glass/PET. An integrated photovoltaic modular panel has at least one photovoltaic unit. The photovoltaic unit has at least one solar cell strip with its two electrode plugs respectively connected with a connector. The connector itself has a predetermined width and length, with a plug and a socket on both ends, a slantwise or upright electrode plug-in socket at the waist. The solar cell strip can be inserted slantwise or upright into the connector. The connector, a metal piece of stamping or casting, is an integrated electric piece with plug, socket and waist. The section of the plug looks like spindle. The socket is a slot with its section in an X form. There is an insulating crust around the connector, forming a plastic injection molding module, with fixed holes on the crust or on the proper place of up and down surface. The plug of the connector protrudes away from the module. The socket and the electrode plug-in socket of the connector are concealed in the module.

The invention standardizes photovoltaic units and modularizes photovoltaic panels. With a standard plug, photovoltaic units can be integrated together in various ways. The photovoltaic panel main body can easily be modified according to field applications. The assembly process of a photovoltaic panel main body by using prepared photovoltaic units is quick and easy. The photovoltaic panel main body is suitable for mass production. Even at the construction site, the photovoltaic panel main body can be easily combined with different kinds of glass, forming into different kinds of photovoltaic curtain wall glass.

Solar cells in an integrated photovoltaic modular panel here are thin film solar cells. The low cost solar cells employ nanometer semiconductor active layer deposited on an inexpensive substrate using a low temperature technology, such as glass, without silicon wafer. So the integrated photovoltaic panel here can be competitive and with market potential.

BRIEF DESCRIPTION OF THE DRAWINGS

In the drawings:

FIGS. 2-1 is a front elevation view of FIG. 2;

FIGS. 2-2 is a cross-sectional view of A-A plane of FIG. 2;

FIGS. 2-3 are schematic views of the connecting effect of FIG. 2;

FIG. 3 is a schematic view of a connector with a slantwise electrode plug-in socket in according with the present invention;

FIGS. 4-1 is a schematic view of the connecting effect of FIG. 4;

DETAILED DESCRIPTION OF THE PREFERRED EMBODIMENT

Figure 1:
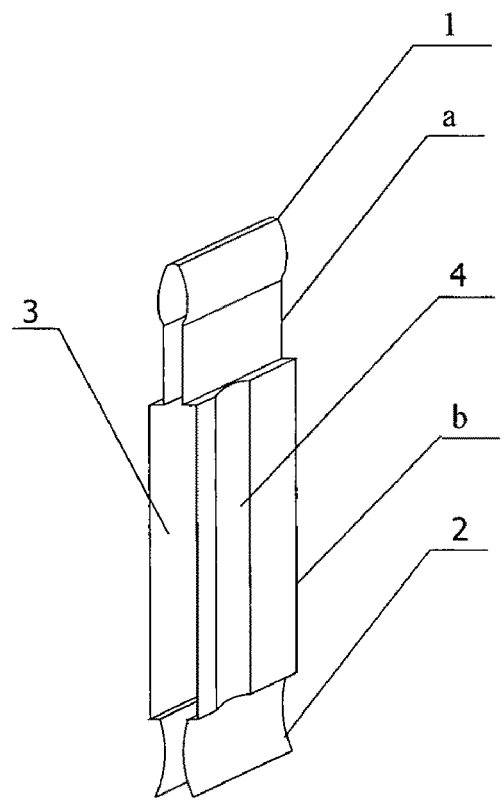
FIG. 1 is a schematic view of a metal connector in accordance with the present invention.
Figure 5:
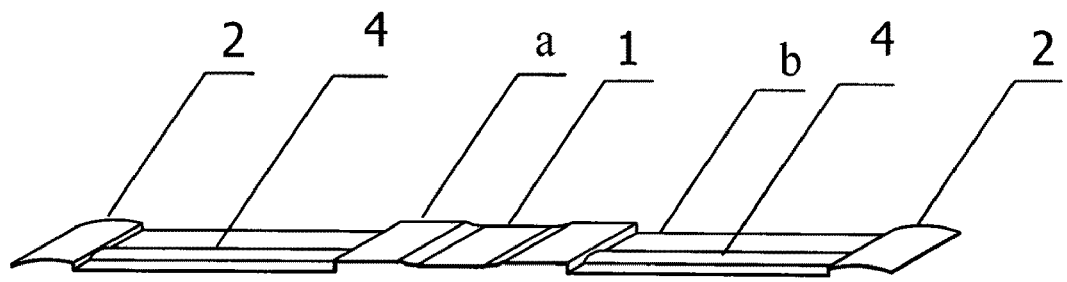
FIG. 5 is a schematic view of FIG. 1. outspreaded evenly.

Referring first to FIG. 1 and FIG. 5 showing a connector with a plug 1 and a socket 2 on opposite ends, a neck a and a waist b situated inbetween the opposite ends. As shown, plug 1 has an outer convex, looking like spindle. The neck a is plane and flat. The socket on the bottom with outer biconcave and inner convex configurations, forming a slot. It forms a tight fit when plug 1 of a connector inserts into socket 2 of another connector. There is an upright electrode plug-in socket 3 situated in neck a and waist b. A straight strip 4 is located on both sides of waist b. The straight strip 4 is inner convex and outer concave as shown, so it can firmly fasten an inserted solar cell like an elastic clamp, providing excellent electrical contact with electrodes on the inserted solar cell. Generally, the connector is a copper electrode piece with thickness. The length of the waist b, here being the same length as the electrode plug-in socket, is approximately the same size as the width of the inserted solar cell.

Figure 2:
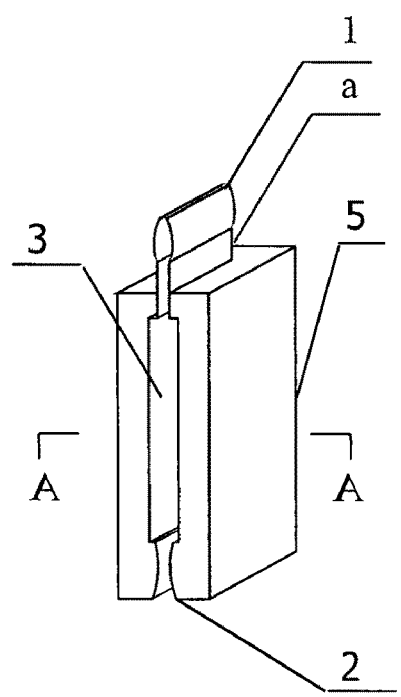
FIG. 2 is a schematic view of a plastic injection molding crust around the metal connector of FIG. 1.
Figures 1, 2:
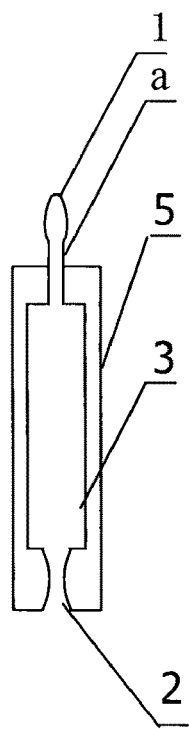
Figure 2:
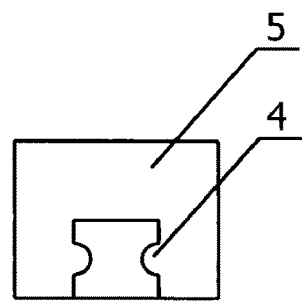

FIG. 5 is a schematic view of FIG. 1 outspreaded evenly. As shown, the connector may be a metal piece of stamping. When the metal piece outspreaded evenly is folded back to back, the connector is formed. The connector may also be a metal piece of casting. The upright electrode plug-in socket 3 is a cleft between two metal sides of waist b. The inner side of straight strip 4 is convex, providing excellent electrical contact with inserted electrode to be firmly fastened like a clamp. As shown in FIG. 2, there is a plastic injection molding crust 5 surrounding the connector of FIG. 1. The plastic injection molding crust 5 may be a hexagon prism insulatedly affixed to the connector, forming a module. Plug 1 and neck a protrude away from the module. Socket 2 and upright electrode plug-in socket 3 are concealed in the module. So the plastic injection molding crust 5 enables electrodes of photovoltaic units to electrically connect with each other. The plastic injection molding crust 5, which itself is a standard piece and is congruent with architecture aesthetics, is designed to insulate, affix and secure a photovoltaic panel. Reference signs in FIGS. 2-1, FIGS. 2-2 and FIGS. 2-3 have the same meaning as mentioned above.

Figures 2, 3:
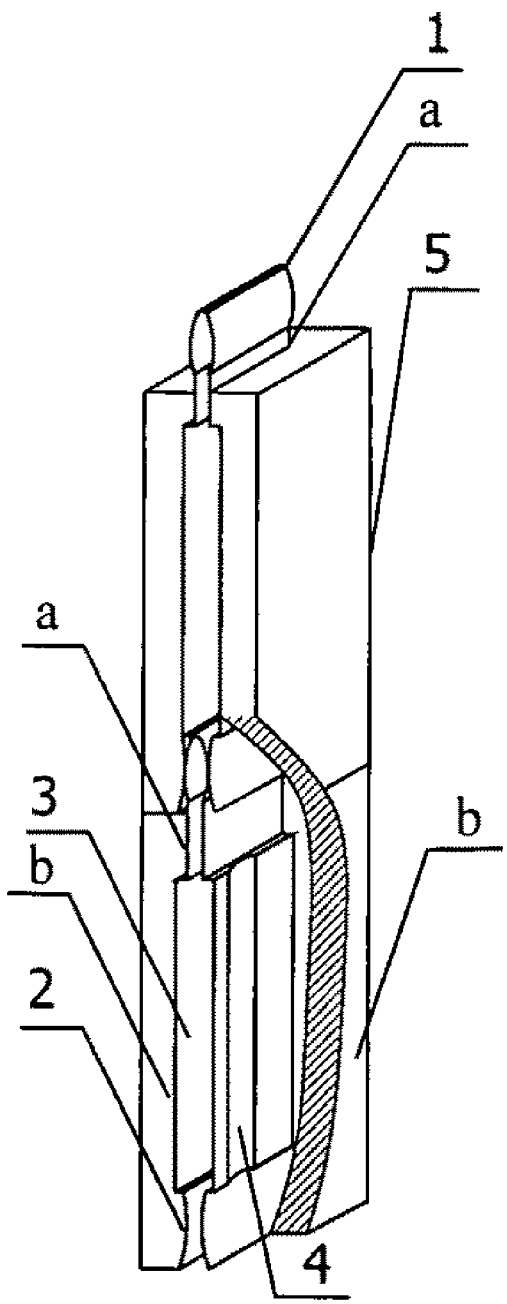
Figure 3:
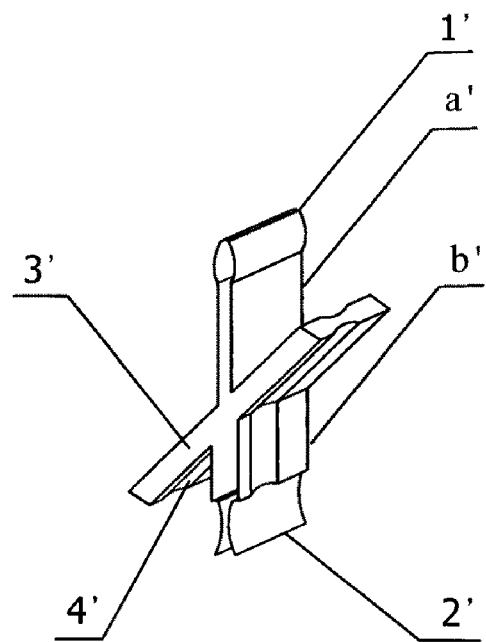
Figure 6:
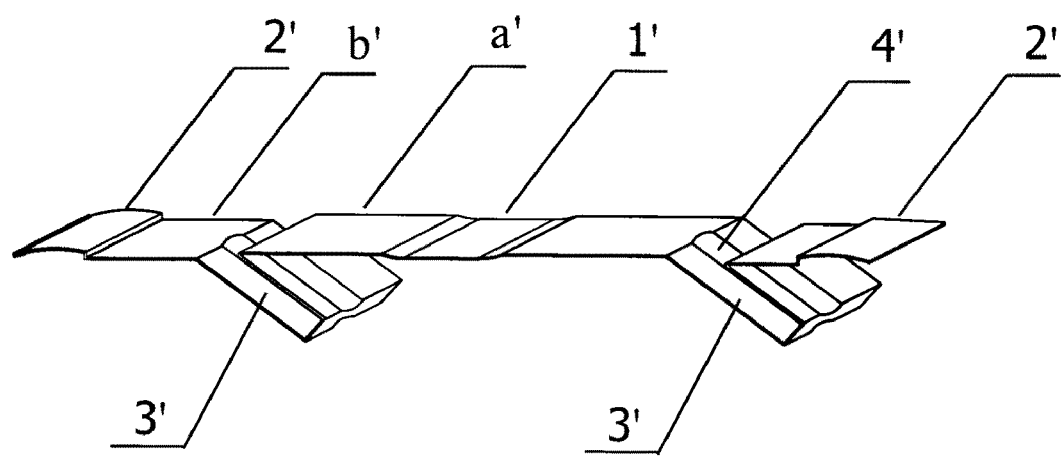
FIG. 6 is a schematic view of FIG. 3. outspreaded evenly.

Referring to FIG. 3 and FIG. 6, another embodiment of connector is shown, which has a slantwise electrode plug-in socket 3'. It is similar to the preferred embodiment as shown in FIG. 1 but a prescribed angle exists between a surface of the slantwise electrode plug-in socket 3' and the surface of the neck a' or the waist b'. Plug 1 has an outer convex shape, looking like a spindle. Located under the neck a', the socket 2' is outer concave and inner convex at two sides, forming a slot. It has excellent electrical contact when plug 1' is inserted into socket 2' for a tight fit. There is a straight strip 4' on both sides of the slantwise electrode hole 3', each is inner convex and outer concave. So the straight strip 4' can firmly fasten the inserted solar cell like an elastic clamp, providing excellent electrical contact with the electrodes.

Figure 4:
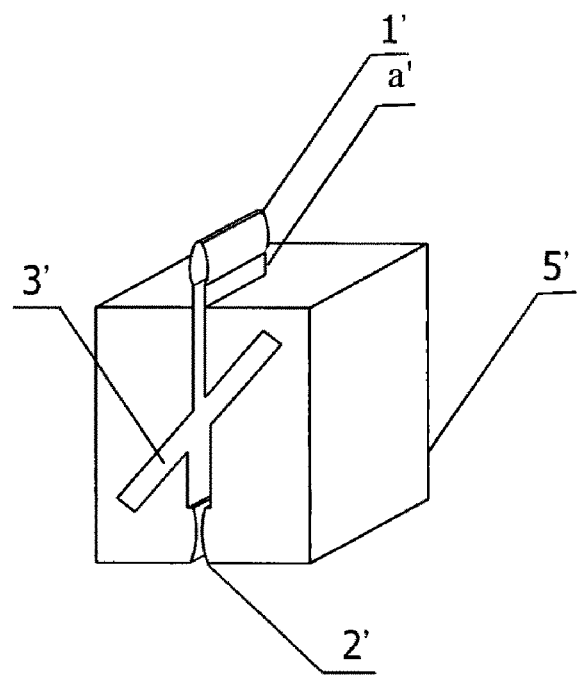
FIG. 4 is a schematic view of a plastic injection molding crust around the connector with a slantwise electrode plug-in socket of FIG. 3.
Figures 1, 4:
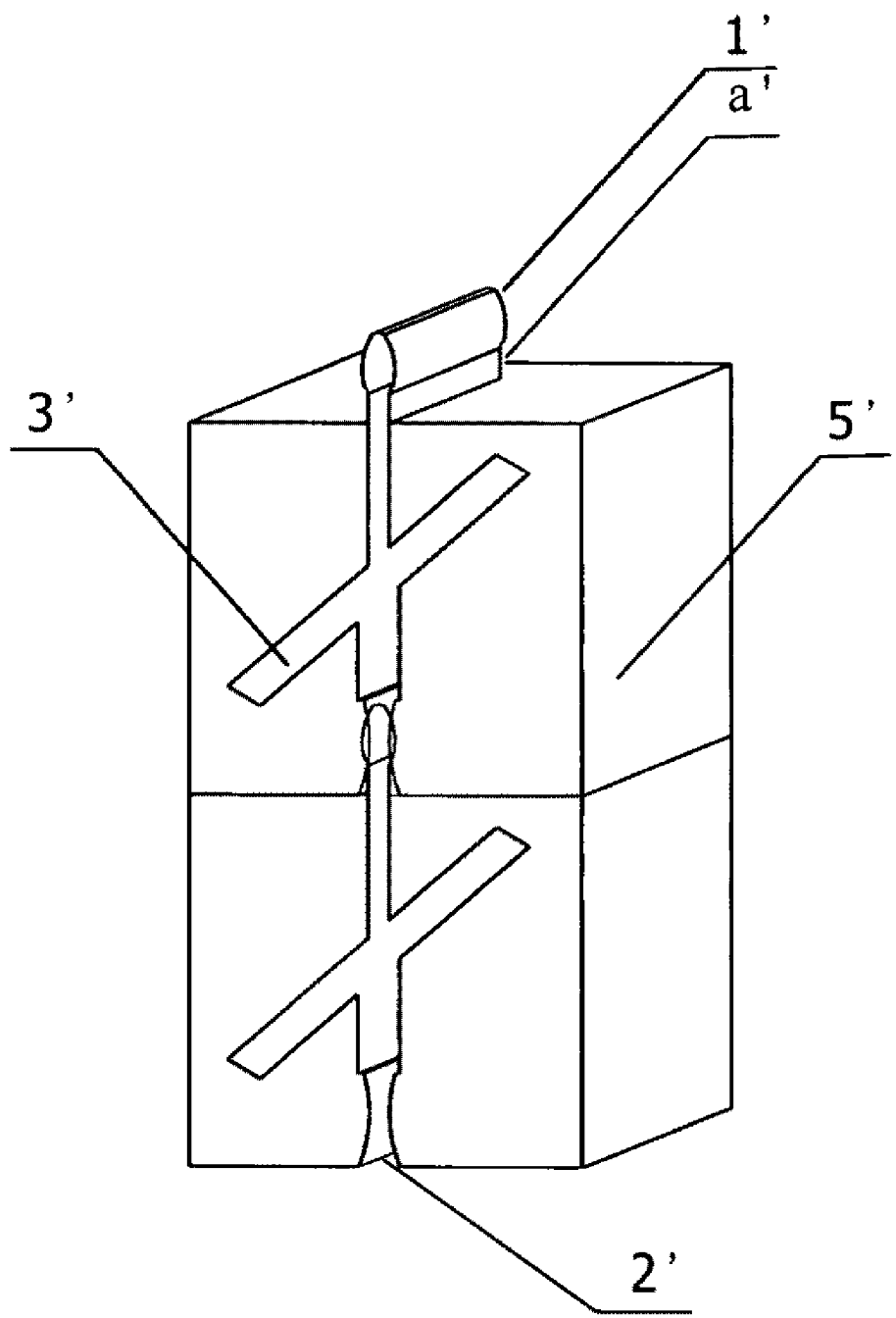

Referring to FIG. 4 and FIGS. 4-1, a plastic injection molding crust 5' surrounds the connector of FIG. 3 is shown. The plastic injection molding crust 5' is also a standardized piece, usually being a hexagonal prism shape. Plug 1' and neck a' protrude away from the plastic injection molding crust 5'. Socket 2' and upright electrode plug-in socket 3' are housed in the plastic injection molding crust 5'. Plastic injection molding crust 5' serves the same function as curst 5 mentioned in FIG. 2, for example, to insulate, affix and secured the connector.

Figure 7:
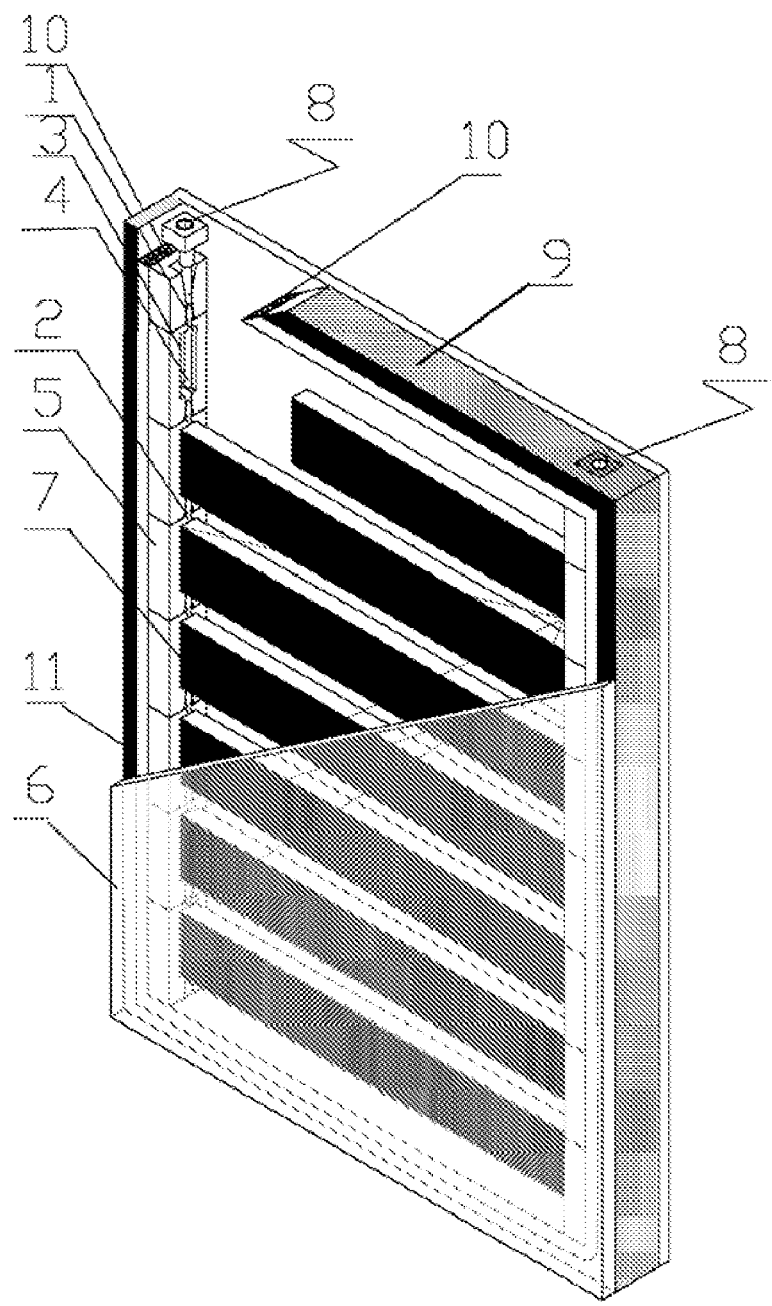
FIG. 7 is a hollow photovoltaic curtain wall glass according to the first embodiment of the present invention.

Referring to FIG. 7, a photovoltaic panel according to the present invention is shown with hollow glass. Then film solar cell 7 is laid-out as a strip. A standard photovoltaic unit is formed by connecting each end of the thin film solar cell strip 7 with a connector. The connector is a standardized piece after stamping processing of a metal piece and surrounded by a plastic injection molding crust 5. The connector has a plug 1 and a socket 2 on both ends, a neck a, and an electrode plug-in socket 3. The straight strip 4 is located on each sides of waist b. The straight strip 4 has inner convex and outer concave shapes, so its can firmly hold the inserted solar cell like an elastic clamp. The photovoltaic units in the photovoltaic panel main body are arranged at intervals to allow light transmission. The photovoltaic panel main body is installed in a vertical aluminum frame 9 mounted adjacent edges of hollow glass 6. Exterior electrodes 8 is an element that connects with an exterior positive electrode and an exterior negative electrode. Molecule mesh 10 and seal glue 11 are also representatively shown in FIG. 7.

Size and amount of output power of a photovoltaic curtain wall glass according to this invention can be adjusted based on needs. Solar cells may be thin film solar cells with specifications in compliance with requirements of the battery material industry. Amorphous silicon solar cell is the best choice due to abundance in supply and low cost. Solar cells are cut into strips with prescribed width and length based on design specifications, which may be 12V, 24V, 48V or others. A solar cell strip connects with connectors on both ends, forming a photovoltaic module. A photovoltaic module is a photovoltaic unit. A photovoltaic panel main body can include multiple photovoltaic units. In actual applications, the photovoltaic unit is standardized in various sizes according to the dimension of the inner frame of a curtain wall glass.

Furthermore, the standardized photovoltaic units can be easily installed to the inner frame of the curtain wall glass, without changing the structure of the inner frame and without grooving on the aluminum frame to install cells. The connectors, themselves being conductive, form internal electrode connection by being plugged together, with a positive electrode bar and a negative electrode bar respectively on each side of the photovoltaic panel main body. Crusts around the connector, aligned in parallel, serve as insulators between the photovoltaic panel main body and the inner frame of a curtain wall glass. In summary, connectors are key elements in the invention. First, they form internal electrodes, with a positive electrode bar and a negative electrode bar respectively on each side of the photovoltaic panel main body. Second, connectors and crusts form the frame of the photovoltaic panel main body to provide insulation, stability and protection functions.

The photovoltaic curtain wall glass according to this invention has multiple usages. For example, it can be used as curtain wall, window, roof, greenhouse shed, swimming pool and so on.

For illustrative purposes, several embodiments of the present invention are further described below:

The first embodiment is a photovoltaic hollow curtain wall glass. A photovoltaic unit is formed when two ends of the solar cell strip, i.e., a positive electrode and a negative electrode, are respectively connected with a connector with a slantwise electrode plug-in socket 3' as shown in FIG. 3 and FIG. 4. Multiple photovoltaic units, equipped with crust 5' around the connector, composes a photovoltaic panel main body through inserting the plug 1' into the socket 2' much like stacking building blocks. Internal electrodes of the photovoltaic panel main body are formed with a positive electrode bar and a negative electrode bar respectively connected in parallel. The left frame and the right frame of the photovoltaic panel main body are formed by stacking together multiple crusts 5'. The photovoltaic units in the photovoltaic panel main body are arranged with intervals for light transmission. The photovoltaic panel main body can be directly installed in the inner frame of a hollow curtain wall glass. Solar cells in the photovoltaic panel main body look like louvered slats in a Venetian blind for it is slantwise to the vertical plane of the curtain wall glass.

In this embodiment, the connector with a slantwise electrode plug-in socket 3' as shown in FIG. 3 and FIG. 4 can be substituted by an upright electrode plug-in socket 3 as shown in FIG. 1 and FIG. 2. A photovoltaic unit is formed when both ends of the solar cell strip, a positive electrode and a negative electrode, are respectively connected with a connector in the upright electrode plug-in socket 3. The photovoltaic panel main body including multiple photovoltaic units can also be installed in the inner frame of a hollow curtain wall glass. Solar cells in the photovoltaic panel main body, aligned in parallel with the curtain wall glass and having intervals for light transmission, appears like louvered slats.

Figure 8:
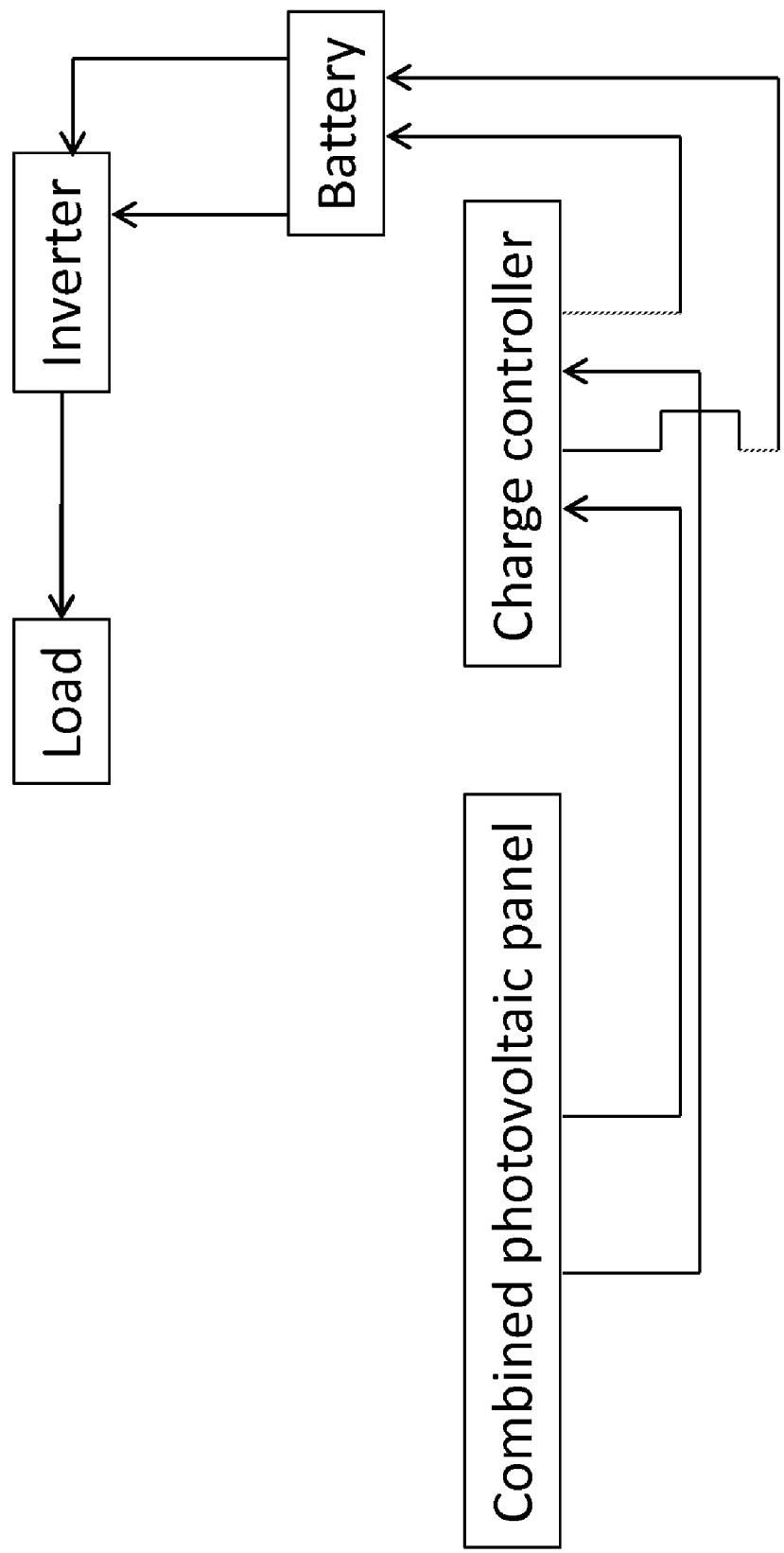
FIG. 8 is a stand-alone electricity supply system according the second embodiment of the present invention.

The second embodiment is a stand-alone power supply system. Photovoltaic arrays comprising multiple integrated photovoltaic panels as mentioned above are parts of a stand-alone power supply system or a grid-connected power generation network. Referring to FIG. 8, A stand-alone power supply system generally has an integrated photovoltaic panel 35, a charge controller 40, an inverter 25 and a battery 30. When voltage level of the output power produced by the integrated photovoltaic panel 35 reaches a predetermined level, charger controller 40 the electrical power can be stored in a battery 30 or 12 v, 24 v or 48 v. And then the inverter 25 converts direct current with low voltage to alternating current with 110 v or 220 v, providing a load 20 with steady and secure electrical power.

The third embodiment is a photovoltaic panel main body integrated with low-emissivity coated glass (low-E glass) or low-iron toughened texture glass (white glass). The photovoltaic panel main body as mentioned above is installed in the middle of low-E glass or white glass. Internal electrodes are fixed and insulated with the inner frame of the glass by coating glue on the surface of the frame. To ensure satisfactory sealing, seal glue is placed between the surface of the photovoltaic panel main body and exterior glass. Internal electrodes are connected with exterior electrodes. Exterior electrodes are exposed to air. The frame of the photovoltaic panel main body is concealed inside the glass.

The fourth embodiment is a photovoltaic curtain wall glass without requiring additional floor space. The photovoltaic unit in the photovoltaic curtain wall glass can be made into a standardized piece. During installation, photovoltaic units are plugging together just like stacking building blocks. The crust around the connector may have fixed holes on the top and bottom surface to strengthen the frame of internal electrodes.

The fifth embodiment is a photovoltaic panel main body integrated with decorated glass. Solar cells in the photovoltaic panel main body may be amorphous silicon solar cells of low light. The back glass of the solar cells may be decorated with artistic figures. So the photovoltaic panel main body not only supplies electrical power but also project aesthetic appeal.

In summary, the integrated photovoltaic curtain wall glass according to the present invention not only has the advantage of converting solar energy into electrical power, but also has other advantages, such as being transparent, heat insulating, sound insulating, reducing light pollution and so on. In recent years, social consciousness about health and environment protection increase all over the world. Public attention focuses on clean energy, especially solar energy as it is available any place in the world. On average, each square meter on the earth can receive 1000 kWh of solar energy annually. The establishment of energy requirements will greatly promote the development and use of solar energy. The era of using mass produced photovoltaic curtain wall glass is at hand.

The invention claimed is:

1. A photovoltaic glass curtain wall system, comprising:
a curtain wall glass; and
a thin-film photovoltaic panel integrated into the curtain wall glass, wherein the thin-film photovoltaic panel includes a plurality of modular photovoltaic units, each photovoltaic unit formed by a thin-film solar cell strip and corresponding first and second connectors;
a positive electrode and a negative electrode of each thin-film solar cell strip are inserted into the corresponding first and second connectors;
the first connectors of the plurality of photovoltaic units are configured to be plugged together to form a first internal electrode connection leading to a first exterior electrode of the curtain wall glass; and
the second connectors of the plurality of photovoltaic units are configured to be plugged together to form a second internal electrode connection leading to a second exterior electrode of the curtain wall glass.

2. The system according to claim 1, wherein:
the first and second connectors each includes a plug and a waist containing an electrode plug-in socket, the waist having a biconcave outer surface and a convex inner surface on each side of the waist and the plug having a neck.

3. The system according to claim 2, wherein:

the plug is of a shape of a spindle; and each connector includes a second plug-in socket at an end of each connector, the second plug-in socket being of a shape of a slot having biconcave outer surfaces and convex inner surfaces such that the plug of a connector can be inserted into the second plug-in socket of a neighboring connector to form a tightly fit connection with electrical contact.

4. The system according to claim 2, wherein:

each connector includes a second plug-in socket at an end of each connector, the second plug-in socket being of a shape of a slot having biconcave outer surfaces and convex inner surfaces such that the plug of a connector can be inserted into the second plug-in socket of a neighboring connector to form a tightly fit connection with electrical contact.

* * * * *